United States Patent [19]
Davis, Jr. et al.

[11] Patent Number: 5,162,970
[45] Date of Patent: Nov. 10, 1992

[54] MINIATURE MONOLITHIC CERAMIC COUPLER FOR ELECTRONIC CIRCUITS

[75] Inventors: Donald J. Davis, Jr., Rocky Point, N.Y.; Victor Insetta, Jacksonville, Fla.

[73] Assignee: American Technical Ceramics Corporation, Huntington Station, N.Y.

[21] Appl. No.: 826,403

[22] Filed: Jan. 27, 1992

[51] Int. Cl.$^5$ .......................... H01G 4/10; H03H 7/00
[52] U.S. Cl. ..................................... 361/321; 333/184
[58] Field of Search ....................... 361/306, 320, 321; 333/184, 185; 357/51; 29/25.42

[56] References Cited

U.S. PATENT DOCUMENTS

| | | | |
|---|---|---|---|
| 3,745,430 | 7/1973 | Lunquist et al. | 361/321 |
| 4,149,302 | 4/1979 | Cook | 29/25.42 |
| 4,904,967 | 2/1990 | Morii et al. | 361/321 X |
| 5,027,253 | 6/1991 | Lauffer et al. | 361/321 |
| 5,034,709 | 7/1991 | Azumi et al. | 361/321 X |

Primary Examiner—Donald Griffin
Attorney, Agent, or Firm—Edward H. Loveman

[57] ABSTRACT

An inductive coupling device for external circuitry to pass electric currents therethrough via inductively coupled electrodes, comprises a monolithic, dielectric, ceramic block made from a multiplicity of stacked dielectric ceramic plates or layers all bonded together. First and second flat rectangular Z-shaped electrodes are embedded in the block between the ceramic layers and bonded thereto. The electrodes are spaced apart by one dielectric layer and generally overlap at least in part for effectively coupling to each other. The block also carries electrically conductive grounding films or layers bonded to the underside of the top and bottom dielectric layers of the block. These films are coupled to adjacent ones of the Z-shaped electrodes. The block may be rectangular in configuration. Conductive stripes on lateral and end faces of the block contact ends of the Z-shaped electrodes and ends of the grounding films and serve as terminals for connecting external circuitry thereto.

8 Claims, 2 Drawing Sheets

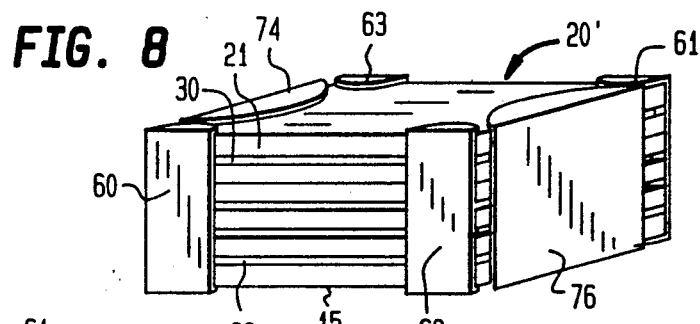
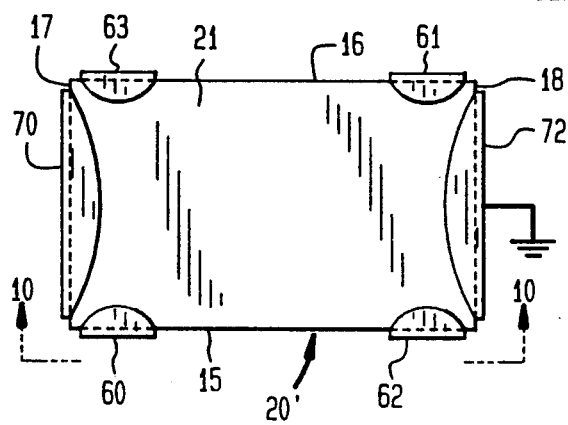
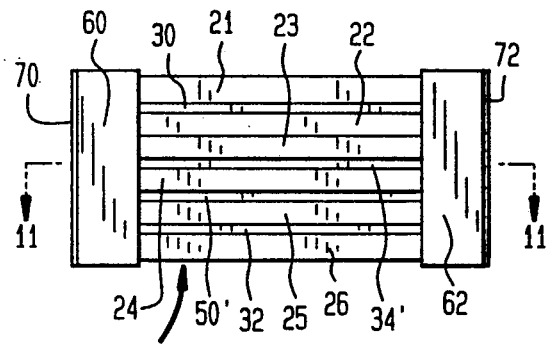
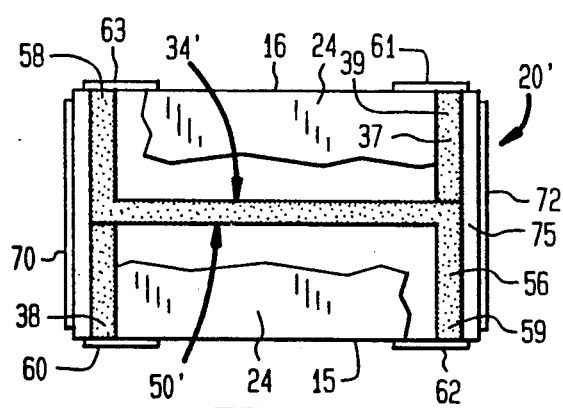
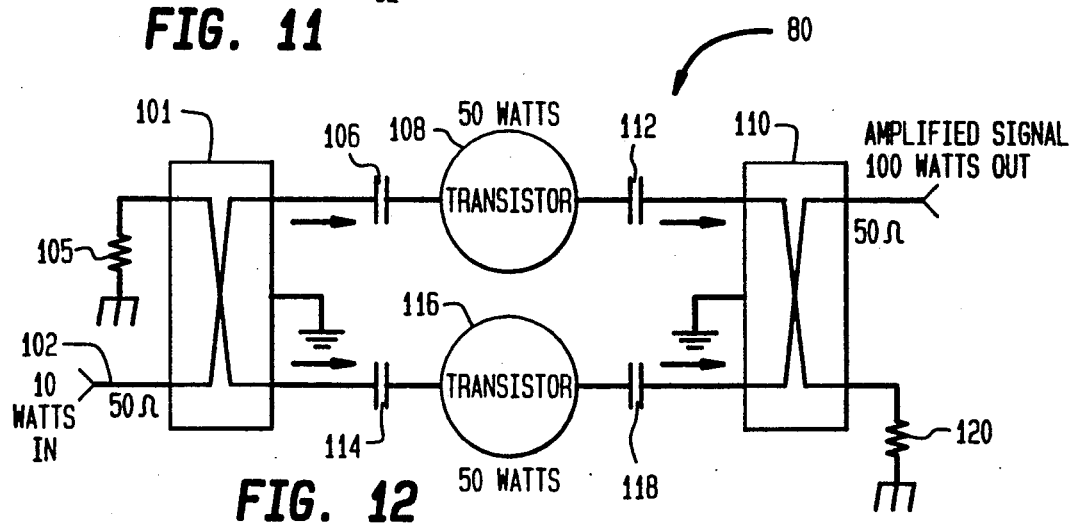

MINIATURE MONOLITHIC CERAMIC COUPLER FOR ELECTRONIC CIRCUITS

BACKGROUND OF THE INVENTION

1. Field of the Invention

This invention relates to the art of electronic coupler devices, and more particularly concerns a miniature monolithic ceramic inductive coupler fabricated from a multiplicity of ceramic layers and electrodes.

2. Description of the Prior Art

Heretofore inductive couplers and dividers used in electronic circuits have been rather large units. As microwave and other electronic circuits have become more and more miniaturized it has become increasingly difficult to provide adequate space for wiring conventional large inductive couplers and dividers into very small spaces available for them. Another objection to the use of large components is that they are not surface mountable on printed circuit boards. The technology of high power transistors has focused the need for surface mounted components to work side by side in these electronic circuits. The need has existed unfilled up to the present invention, for miniature inductive couplers and dividers which are comparable in size with the miniature circuits in which they are required to operate.

SUMMARY OF THE INVENTION

According to the invention there is provided a monolithic electronic inductive coupler which superficially resembles prior known miniature capacitors made from a plurality of ceramic layers. A process for making such capacitors adaptable for making the present monolithic couplers and dividers is described in U.S. Pat. No. 3,235,939 issued Feb. 22, 1966 to A.R. Rodriguez et al. The present invention differs from the prior miniature capacitor in that it employs only two internal overlapping rectangular Z-shaped electrodes which are inductively coupled to each other in a monolithic ceramic block. In addition the inductive coupler has two grounding planes or films in the monolithic block. The two grounding films are respectively coupled to the two Z-shaped electrodes. The miniature coupler unit or block can be inserted into very small available space in external circuits. Currents passed to one electrode and an adjacent grounding film can be taken off from the other electrode and adjacent grounding film. The unit, which can be used in a combiner or divider form, is usable in amplifiers and power modules for passing a signal into the unit via an element and for passing the signal out of the unit via an element coupled to the first element, with the coupling providing as much as two output or two input signal paths.

These and other objects and many of the attendant advantages of this invention will be readily appreciated as the same becomes better understood by reference to the following detailed description when considered in connection with the accompanying drawing in which:

BRIEF DESCRIPTION OF THE DRAWINGS

FIG. 8 is a reduced perspective view of a coupler device similar to FIG. 1 with circuit terminals applied to certain faces of the devices;

FIG. 9 is an enlarged top plan view of the coupler device of FIG. 8 with circuit terminals shown applied to four faces of the device;

FIG. 10 is a side elevational view of the coupler device, taken along lines 10—10 of FIG. 9;

FIG. 11 is a horizontal sectional view taken along line 11—11 of FIG. 10 with portions of an internal ceramic spacer broken away to show relative positions of internal electrodes; and FIG. 12 is a diagram of an electric circuit illustrating one way in which the coupler devices of FIGS. 1-11 can be used.

DESCRIPTION OF THE PREFERRED EMBODIMENTS

Figure 1:
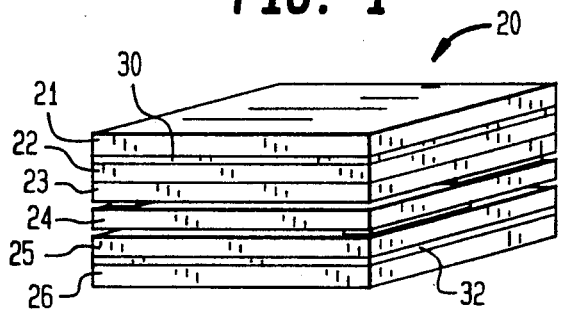
FIG. 1 is a perspective view of a greatly enlarged inductive coupler device or divider embodying the invention.
Figure 3:
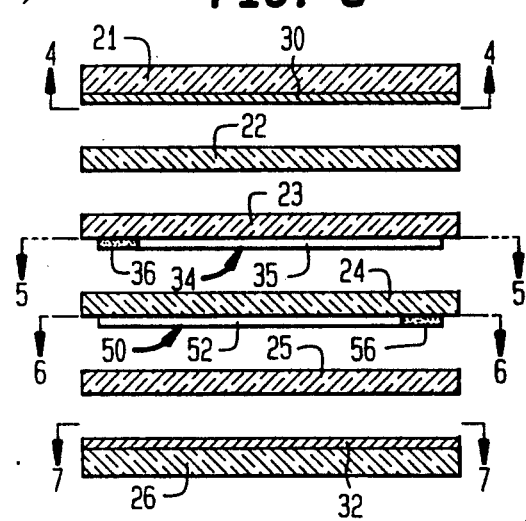
FIG. 3 is an exploded cross sectional view taken along line 3—3 of FIG. 2.
Figure 2:
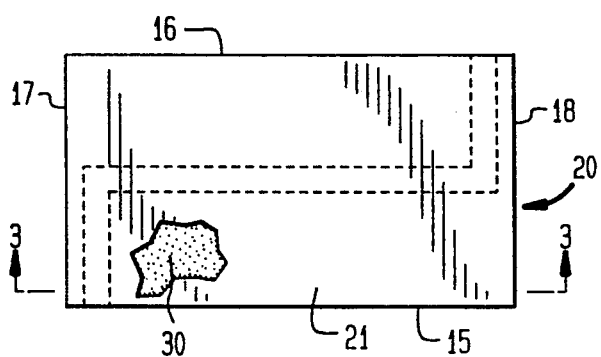
FIG. 2 is a further enlarged top plan view of the coupler device of FIG. 1.
Figure 4:
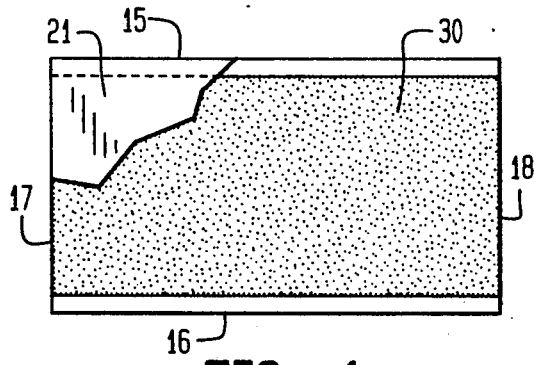
FIG. 4 is a bottom plan view taken along line 4—4 of FIG. 3, with part of a grounding layer broken away.

Referring now to the drawings wherein like-reference characters designate like or corresponding parts throughout, there is illustrated in FIGS. 1, 2 and 3 and inductive coupler device generally designated as numeral 20. The device 20 has a rectangular configuration in plan view as best shown in FIGS. 2, 4-7. The coupler unit 20 has a monolithic, solid, integrated block structure with opposed, rectangular lateral faces 15, 16 and end faces 17, 18. However, in fabricating the unit and before firing the several layers 21-26 are arranged in a pile or stack as shown in FIGS. 1 and 3. Each of layers 21-26 is made of dielectric ceramic material. Electrodes are provided on some of the layers as follows. Underneath the top layer 21 and between layers 21 and 22 is a thin film 30 of electrically conductive material, such as metal or a metallic composition which serves as a grounding electrode for the upper part of the coupler device 20. On the bottom layer 26 and between layers 25 and 26 is another thin film 32 of electrically conductive material which serves as a grounding electrode for the lower part of the coupler device 20.

Figure 5:
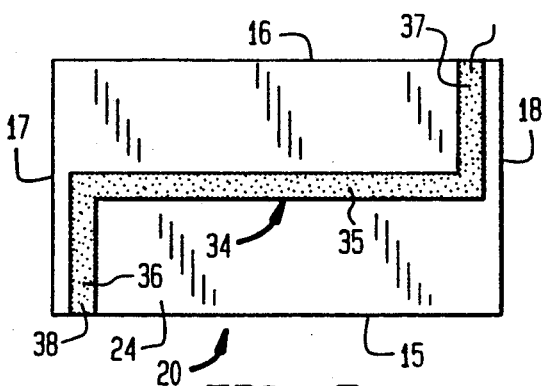

Between dielectric layers 23 and 24 is an upper electrode 34 which is a very thin electrically conductive film. As best shown in FIG. 5, the electrode 34 has a rectangular Z-shape with a long narrow body 35. One end of the body 35 is integral with and perpendicular to a coplanar narrow arm 36. The other end 38 of the arm 36 terminates at the lateral face 15 of the coupler 20. The outer end 37 of the arm 37 terminates at the face 16 of the coupler 20. The arm is slightly spaced from the end face 17 of the coupler 20. The arm 37 is slightly spaced from the end face 18 of the coupler 20.

Figure 6:
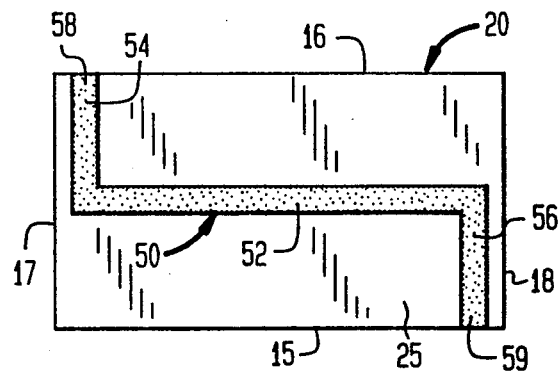
FIGS. 5, 6 and 7 are horizontal plan views taken along lines 5—5, 6—6 and 7—7 respectively of FIG. 3.

Between dielectric layers 24 and 25 is a lower electrode 50 which is a very thin electrically conductive film. As best shown in FIG. 6 the electrode 50 has a rectangular Z-shape with a long narrow body 52. One end of the body 52 is integral with and perpendicular to a coplanar narrow arm 54. The other end of the body 52 is integral with and perpendicular to a narrow coplanar arm 56. An outer end 58 of the arm 54 terminates at the lateral face 16 of the coupler 20. An outer end 59 of the arm 56 terminates at the face 15 of the coupler 20. The arm 54 is slightly spaced from the end face 17 and the arm 56 is slightly spaced from the end face 18.

Depending on the lengths of the arms 36, 37 of the electrode 34, and the lengths of the arms 54 and 56 of the electrode 50, the bodies 35 and 52 can be disposed directly one above the other, or offset slightly from each other, or partially overlapping one another. The amount of overlap or separation of the bodies 35 and 52 from each other in their respective planes will determine the amount of coupling between the two electrodes 34 and 50. Inductive coupling will be maximum when body 35 is disposed directly over body 52 with edges in registration but spaced apart by the ceramic layer 24.

Figure 7:
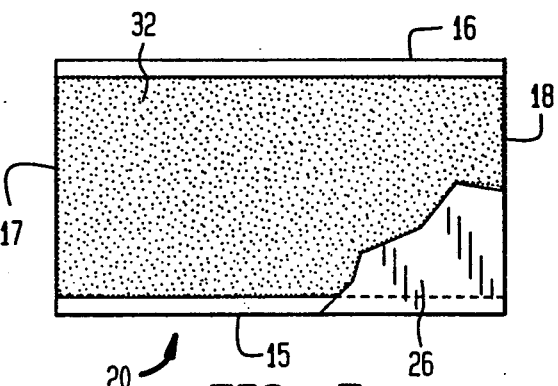

FIG. 7 shows the grounding plane 32 on the ceramic layer 26, part of the electrode 32 being broken away to show the layer 26. The electrode 32 serves as a grounding electrode for the lower electrode 50, and the film 30 serves as the grounding electrode for the ulpper electrode 34.

In order to connect the inductive coupling device 20 (FIG. 8) to external circuitry there are provided four lateral circuit terminal 60, 61, 62 and 63 shown in FIGS. 8-11. The terminals are permanently secured electrically conductive stripes made of suitable conductive material. A pair of terminals 60 and 61, as best shown in FIGS. 9-11 are in contact with the ends 38 and 39 respectively of the electrode 34' at the ends of the arms 36 and 37 respectively. The terminal 60 is applied to the lateral face 15 and the terminal 61 is applied to the lateral face 16. The terminals 60 and 61 provide means for connecting the electrode 34' to external circuitry. A terminal 63 is applied to face 16 in contact with the left end of the grounding film 30 and the left end of the grounding film 32; see FIG. 10. The right end of the film 30 and the right end of the film 32 is in contact with a conductive stripe 72 on the end face 18. The stripes 70 and 72 are connected to film 74 (FIG. 8) to provide a ground to an external circuit.

Other parts of the coupling device 20' are identical to device 20 and are indentically numbered. In FIG. 11 parts of ceramic layer 24 located between electrodes 34' and 50' are broken away to show more clearly the relative overlapping positions of the rectangular Z-shaped electrodes 34' and 50'.

In FIG. 12 is shown the coupler 20 employed as both a coupler 110 and a divider 101 in a circuit 80. The divider 101 has a RF signal source 102 connected to the terminal 60 of the electrode 34'. A 50 ohm resistor 105 is grounded at one end and is connected to the terminal 63 of the electrode 50'. The other terminal end 61 of the electorde 34', of the divider 101 is connected through a capacitor 106 to a 50 ohm resistor 108, a capacitor 112 to the terminal 62 of the coupler 110. Similarly, the other terminal end 62 of the electrode 50' of the divider 101 is connected through a capacitor 114, a 50 watt transistor 116, capacitor 118 to the terminal end 60 of the electrode 34' in the coupler 110. The amplified RF signal of 100 watts is taken from the electrode 334 at the terminal end 61 of the coupler 110. A 50 ohm resistor 120 is connected to the terminal end 63 of the electrode 50'.

It will be understood from the foregoing that the units 20, 20' 101 and 110 are miniature in size to enable the monolithic blocks to fit into very small spaces in external circuits. The units are in general rectangular in plan view and may be less than three-quarters of an inch in width and less than an inch in length. The resulting momolithic block defined by the bonded layers 21-26 is one half the size of current couplers or dividers.

It should be understood that the foregoing relates to a limited number of preferred embodiments of the invention which have been by way of and that it is intended to cover all changes and modifications of the examples of the invention herein chosen for the purpose of the disclosure, which do not constitute departures from the spirit and scope of the invention.

What is claimed is:

1. An inductive coupling device for electronic circuitry, comprising:
   a monolithic dielectric block formed from a multiplicity of stacked dielectric layers all bonded together;
   a first flat electrically conductive electrode embedded in said block between two of said layers and bonded thereto;
   a second flat electrically conductive electrode embedded in said block between one of said two layers and a third one of say layers, said electrodes overlapping each other at least in part for effectively inductively coupling device therebetween; and;
   two electrically conductive grounding films bonded to top and bottom ones of said ceramic layers inside said block adjacent electrodes respectively for electrically inductively coupling voltages between said films and said electrodes, and for defining two coupled current paths through said block.

2. An inductive coupling device as claimed in claim 1, wherein each of said electrodes is rectangular Z-shaped and wherein both of said electrodes is rectangular Z-shaped and wherein both of said electrodes have long, narrow bodies for effectively inductively coupling said voltages between said electrodes.

3. An inductive coupling device as claimed in claim 2, wherein said block is rectangular in plan view and miniature in size to allow said block to be inserted into a very small space in an external circuit.

4. An inductive coupling device as claimed in claim 3, wherein said block is not more than three-quarters of an inch in width and not more than one inch in length in plan view to fit easily into said small space in said external circuit.

5. An inductive coupling device as claimed in claim 2, further comprising electrically conductive stripes applied to opposite lateral faces of said block in contact with ends of said electrodes to serve as terminals for connecting external circuitry to said electrode.

6. An inductive device as claimed in claim 5, further comprising other electrically conductive stripes applied to opposite end faces of said block in contact with ends of said grounding films to serve as grounding terminals for connecting said external circuitry to said grounding films.

7. An inductive coupling device as claimed in claim 6, wherein said block is rectangular in plan view to miniature in size and allow said block to be inserted into very small space in an external circuit.

8. An inductive coupling device as claimed in claim 6, wherein said block is miniature in size, to fit easily into a small space in said external circuitry.

* * * * *